US011002167B2

(12) United States Patent
Cook

(10) Patent No.: US 11,002,167 B2
(45) Date of Patent: May 11, 2021

(54) WIRELESS POWER TRANSFER SYSTEM

(71) Applicant: Rail Propulsion Systems, Fullerton, CA (US)

(72) Inventor: David Cook, Fullerton, CA (US)

(73) Assignee: Clean Train Propulsion, Fullerton, CA (US)

( * ) Notice: Subject to any disclaimer, the term of this patent is extended or adjusted under 35 U.S.C. 154(b) by 0 days.

(21) Appl. No.: 16/681,809

(22) Filed: Nov. 12, 2019

(65) Prior Publication Data
US 2020/0080455 A1     Mar. 12, 2020

Related U.S. Application Data

(63) Continuation of application No. 15/820,424, filed on Nov. 21, 2017, now Pat. No. 10,473,012.
(Continued)

(51) Int. Cl.
   *G01R 31/3842*     (2019.01)
   *G01R 31/367*     (2019.01)
(Continued)

(52) U.S. Cl.
   CPC ........... *F01N 3/2013* (2013.01); *F01N 3/106* (2013.01); *F01N 3/2033* (2013.01);
(Continued)

(58) Field of Classification Search
   CPC ...... F01N 3/2013; F01N 3/106; F01N 3/2033; F01N 3/2066; F01N 11/002; F01N 2610/02; F01N 2610/1453; F01N 2560/06; G01R 31/3842; G01R 31/367; G06Q 30/0645; Y02T 10/12; Y02T 10/40; B60L 7/10; B60L 2200/26; B60M 7/003
(Continued)

(56) References Cited

U.S. PATENT DOCUMENTS

| 6,845,953 | B2 * | 1/2005 | Kane | B61L 23/041 |
| | | | | 246/20 |
| 6,853,888 | B2 * | 2/2005 | Kane | B61L 3/125 |
| | | | | 701/19 |

(Continued)

FOREIGN PATENT DOCUMENTS

| EP | 3542440 A1 * | 9/2019 | G01R 31/36 |
| EP | 3542440 A4 * | 5/2020 | F01N 11/002 |

*Primary Examiner* — Patrick Assouad
*Assistant Examiner* — Sean Curtis
(74) *Attorney, Agent, or Firm* — K&L Gates LLP

(57) ABSTRACT

A wireless power transfer system for a train that includes one or more locomotive units with an energy storage system and one or more passenger cars units that transmit power to the one or more locomotive units. The wireless power transfer system includes one or more HEP cables through which power is provided from the one or more passenger car units to the one or more locomotive units, one or more wireless power transfer (WPT) transmitters mounted to the rail separate from the train, a WPT receiver on one of the one or more passenger cars configured to receive power from one of the one or more WPT transmitters, and an inverter on the one of the one or more passenger car units connected to the HEP cables. The inverter receives power from the WPT receiver and sends the power to the energy storage system through the HEP cables.

20 Claims, 5 Drawing Sheets

Related U.S. Application Data

(60) Provisional application No. 62/424,914, filed on Nov. 21, 2016.

(51) Int. Cl.
  *B60M 7/00* (2006.01)
  *F01N 3/20* (2006.01)
  *F01N 11/00* (2006.01)
  *F01N 3/10* (2006.01)
  *G06Q 30/06* (2012.01)
  *B60L 7/10* (2006.01)

(52) U.S. Cl.
  CPC .......... *F01N 3/2066* (2013.01); *F01N 11/002* (2013.01); *G01R 31/367* (2019.01); *G01R 31/3842* (2019.01); *G06Q 30/0645* (2013.01); *B60L 7/10* (2013.01); *B60L 2200/26* (2013.01); *B60M 7/003* (2013.01); *F01N 2560/06* (2013.01); *F01N 2610/02* (2013.01); *F01N 2610/1453* (2013.01); *Y02T 10/12* (2013.01); *Y02T 10/40* (2013.01)

(58) Field of Classification Search
  USPC .......................... 324/426–427, 444; 705/307
  See application file for complete search history.

(56) References Cited

U.S. PATENT DOCUMENTS

| | | | | |
|---|---|---|---|---|
| 6,865,454 B2* | 3/2005 | Kane | ...................... | B61L 3/008 246/122 R |
| 6,915,191 B2* | 7/2005 | Kane | ................... | B61L 15/0054 701/19 |
| 6,978,195 B2* | 12/2005 | Kane | ...................... | B61L 3/008 701/19 |
| 7,024,289 B2* | 4/2006 | Kane | ...................... | B61L 3/008 701/19 |
| 7,079,926 B2* | 7/2006 | Kane | ................... | B61L 15/0072 701/19 |
| 7,092,801 B2* | 8/2006 | Kane | ................... | B61L 15/0054 701/19 |
| 7,880,337 B2* | 2/2011 | Farkas | ................... | B60L 50/40 307/104 |
| 8,180,544 B2* | 5/2012 | Noffsinger | ................ | B60L 7/16 701/70 |
| 8,371,230 B2* | 2/2013 | Kumar | .................... | B60L 50/51 105/35 |
| 8,428,796 B2* | 4/2013 | Donnelly | ............... | B61D 15/00 701/19 |
| 8,532,842 B2* | 9/2013 | Smith | .................... | B61L 3/006 701/2 |
| 8,988,016 B2* | 3/2015 | Daigle | .................... | B60L 3/104 318/52 |
| 9,100,838 B2* | 8/2015 | Lundquist | ........... | B61L 27/0005 |
| 9,209,736 B2* | 12/2015 | Daigle | ................ | B60L 15/2063 |
| 10,343,551 B2* | 7/2019 | Ahmadi | ................ | B60L 53/126 |
| 10,473,012 B2* | 11/2019 | Cook | .................... | H02J 7/0048 |
| 10,647,203 B2* | 5/2020 | Klingbeil | ............. | B60L 3/0069 |
| 2009/0039656 A1* | 2/2009 | Farley | ...................... | F03G 7/08 290/1 R |
| 2014/0365049 A1* | 12/2014 | Cook | ....................... | B61C 5/00 701/20 |
| 2018/0144398 A1* | 5/2018 | Cook | ...................... | F01N 3/106 |
| 2019/0009690 A1* | 1/2019 | Kumar | .................... | B60L 15/002 |
| 2020/0080455 A1* | 3/2020 | Cook | .................... | F01N 3/2033 |

* cited by examiner

WIRELESS POWER TRANSFER SYSTEM

CROSS-REFERENCE TO RELATED APPLICATIONS

This application claims comprises a continuation of U.S. patent application Ser. No. 15/820,424 filed Nov. 21, 2017, which claims the benefit of benefit of priority to U.S. Provisional Application No. 62/424,914 filed on Nov. 21, 2016, the disclosures of which are incorporated by reference herein.

BACKGROUND OF THE INVENTION

The first portion of the background is related to large modular battery systems that can be used to absorb regenerative braking energy. Some example systems are large battery systems used in battery powered electric locomotives, battery packs that will adsorb the motor braking energy of a crane.

In these cases, the cranes and locomotives have a known capital value and long life up to 30 years. What is challenging to a customer is determining the value and life of a chemically active battery or ultra capacitor cell (terms used interchangeably throughout this section).

In the case of battery powered locomotives, the cost of the battery could make up ½ the cost of the piece of equipment. This is a large capital expense and battery cells have a finite life much shorter than the 15 to 30 year life of many of these pieces of equipment. As the battery cells mature as a technology the life expectancy and performance of these cells is improving but the total cycle life of these cells is unknown so judging their value to justify these large capital purchases is proving to be a challenge.

How a battery cell is used has a significant impact on life expectancy. The higher the C-rate of the power flow in or out of a battery, the more cumulative damage each charge or discharge cycle subjects the battery cell to. C-rate is a term used to describe the ratio of instantaneous current in amps to the batteries energy capacity in amp hours. A typical 18650 battery cell used in a laptop computer could have an amp-hour rating of 3.4 amps. If this battery is charged at 1.7 amps, the it is being charged at a C-rate of 0.5.

It is the discharge and charge cycle caused cumulative damage cycles over time that continuously reduce a battery cells capacity to store energy. When a battery cell drops to a certain portion of its original energy capacity it is usually considered to be at the end of its useful life. In weight and range sensitive applications like light duty automobiles, this end of life energy capacity is 80%. For less weight-sensitive applications such as rail, a lower number like 60% could be acceptable.

Between charging and discharging currents, it is typically the charging currents that cause the most cumulative degradation per cycle. The relationship of C-rate to degradation is not linear. Degradation at a discharge current of 1 C is greater than twice the degradation at a 0.5 C charge rate. When charging a battery overnight at C-rates of less than 0.5 the degradation is minimal. When charging the battery during a regenerative event in a locomotive, the C-rate may be as high a 2.0. It is the hard to predict life expectancy of the batteries that make their value as a capital asset so hard to determine. This is one of the major challenges to the introduction of batteries into rail equipment. What would be desirable would be an effective way to pay for batteries as a consumable like fuel rather than a capital equipment cost due to their shorter and variable life.

The second part of the background is related to the use of wireless power transfer systems (WPT) for rail applications.

The onboard electrification article published in July/August 2014 Steel Wheels (www.railpac.org) discusses a system for electrifying start and stop passenger rail by first adding a Zero Emissions Boost Locomotive (ZEBL) and then adding a wireless power transfer (WPT) system to it. One significant challenge with adding WPT is that one single 20-foot long WPT system would have to fit in between the rails and transfer power at 1.8 MW to transfer 20 kW-hrs in the average 40 second commuter rail stop.

Another significant challenge to WPT for rail applications is that conventional WPT systems require accurate alignment between WPT transmitter and receiver antennas.

The highest capacity individual WPT units currently available for transit buses and light rail applications are only capable of 50 kW and will be over 42" in diameter, possibly 52".

In Korea, there is a WPT system for moving trains that uses long sections of single loop coils much longer than the train it is charging. This system is very economical and can transfer high power levels, but is not practical for applications where people will be near or walking over the track such as in a switching yard or port area. Even some passenger stations have walk ways for passengers to walk across the tracks.

Locomotives operate with an air brake system that has been standardized over decades and while proven to be very reliable and safe, it is not practical to stop a train within a distance of plus or minus a few inches as conventional WPT system require.

What is desired is a practical way to spread out the receivers to absorb the total transmitted power at a lower intensity and without the need for precise stopping locations.

BRIEF SUMMARY OF THE INVENTION

The first portion of the summary is most closely related to a variable rate leasing program for large battery systems used for systems that capture and store regenerative energy.

By using a system similar to 'power by the hour' for aircraft engines, batteries could be leased by the amount of energy taken in and stored or alternately removed from a battery system as measured in the form of kW-hr's. In another embodiment, there would be a variable lease rate depending on the current charging rate to that battery or the discharge rate. In one embodiment, the cost per kW-hr could be linearly proportional to the C-rate, in another embodiment the cost per kW-hr could vary by some nonlinear curve that corresponds more closely to the cumulative deterioration cause by those different charge rates. The simplest system would have only two billing rates, a 'charging' rate for a lower cost per kW-hr, when the C-rate is below a certain level, possibly 0.75 C and a higher 'regeneration' cost rate when the C-rate is above that level. This variable lease billing cost that is a function of the C-rate allows averaging the cost of the battery without having to specify a certain operation cycle which would be a challenge for equipment that operates in different areas at different times. The lower lease cost at lower charge rates would typically apply when the equipment was being charged with electricity from the grid. This lower energy cost would both account for the less deterioration that is being done to the battery, and also it offsets the customers cost of storing that energy in the battery because in addition to paying the lease cost for that kW-hr of storage in the battery the customer is also buying that energy from the electric utility. The goal is to get the combined per kW-hr cost of the battery lease and the grid energy to be below the cost of what the diesel fuel displaced by the battery would have cost the customer on a kW-hr basis. A 'regeneration' lease rate would apply to energy that is essentially free because it would have been wasted if not captured by the battery. Because the customer does not have a per kW-hr cost to buy this energy, the kW-hr cost of the battery can be directly compared to the per kW-hr cost of the diesel fuel that the customer no longer has to purchase. By combining these two different lease cost rates to determine the customers cost to lease the battery, this system averages out the cost of the battery better to better correlate with the deterioration due to variable use, and more rapidly drives down the cost of the battery compared to the fuel it displaces. This reduces the risk for the company that owns the battery to be leased, and makes the lease program more attractive to the end user thereby accelerating the acceptance of batteries for these applications.

As diesel fuel increases in cost and battery cells get cheaper and last longer, the goal is for leasing the battery to cost the customer less than the diesel fuel displaced, providing an operational savings to the customer in comparison to the diesel fuel they would have had to buy.

The second portion of this background is related to the use of wireless power transfer to opportunity charge electrified passenger rail equipment.

A new proposal is to put several WPT receivers underneath each passenger car and then transmit the transferred energy to the ZEBL through the existing HEP power system cables. Per APTA specifications the currently installed HEP cable system could transfer up to 1.2 MW continuous without modification. As WPT will operate at a duty cycle of 30% at most, it may be possible to consistently transmit more than the continuous rating of 1.2 MW for intermittent periods. Additionally, the wires can be increased in capacity and a second set of HEP trainlines can be added as these systems mature.

This would require a power electronics package in each car that would receive the transferred energy from each WPT receiver and convert it to 480 3 phase AC power. Having a power electronics unit in each passenger car allows redundancy, if one cars system would fail, it will have less of an impact on the total system because the systems in the other passengers would still be accepting power and transferring it to the battery in the ZEBL.

This system would not need to add any additional wiring for control of the individual units. The power electronics in each passenger car could communicate with the ZEBL through the HEP cables using currently available powerline communications networking systems. Each train would be its own small micro grid.

Also, the train mounted WPT system could communicate with the station through an inductive coupling system using either the existing WPT coils or an additional coil, coil set or antennas for communications signal transfer.

Putting more low power density units under multiple passenger cars would eliminate the challenge of putting the magnetic receivers under the fuel tanks of the locomotive or ZEBL which could pose a safety risk of inductive power igniting leaking fuel.

Also, the power needed from the grid would be proportional to the amount of passenger cars, as more passenger cars are added the system total power capacity automatically scales up.

This allows using current technology individual WPT (~50 kW) transmitters to be spread out along a longer section length reducing the need for the locomotive to have to stop in a specific spot.

Also, it may increase the time of power transmission by 50%. As a train typically is at a full stop for only 40 seconds, it is slowing to a stop for several seconds and takes up to a minute once started for the last car to pass through the end of the station. If the low density WPT transmitters are extended a short distance before and after the stop area, another minute of power transmission can be accomplished as the train is at low speeds performing the stop and then start. This additional time could double the amount of energy transferred to the train.

This feature also allows scaling up capacity over time. As more and more passenger cars at an agency are equipped with this technology, the stationary system in the track can be expanded, eventually extending out from the station to catch the trains further out from the station when slowing down or accelerating. This spreads out over time not only the infrastructure cost, but also the grid demand.

Another aspect that allows the train to absorb more power than the HEP cables can transmit is the ability to supply each cars internal hotel power loads from its own WPT system.

The third portion of the summary is most closely related to a type of WPT for use on fixed guideway equipment that does not require precise stopping in the travel direction. In addition to conventional fixed guideway vehicles, some other vehicles such as port drayage trucks that repeatedly spend time in the same lane slowly moving in a line benefit from this type of system. Either by the driver keeping the vehicle centered on the path manually or with some kind of system to automatically line the vehicle up on the center line of the path to allow opportunity charging.

Four different transmitter and receiver topologies that eliminate the need for precise stopping along the path of the guideway are discussed in the following detailed description.

Additional objects, advantages and novel features of the examples will be set forth in part in the description which follows, and in part will become apparent to those skilled in the art upon examination of the following description and the accompanying drawings or may be learned by production or operation of the examples. The objects and advantages of the concepts may be realized and attained by means of the methodologies, instrumentalities and combinations particularly pointed out in the appended claims.

BRIEF DESCRIPTION OF THE DRAWINGS

The drawing figures depict one or more implementations in accord with the present concepts, by way of example only, not by way of limitations. In the figures, like reference numerals refer to the same or similar elements.

DETAILED DESCRIPTION OF THE INVENTION

Figure 1:
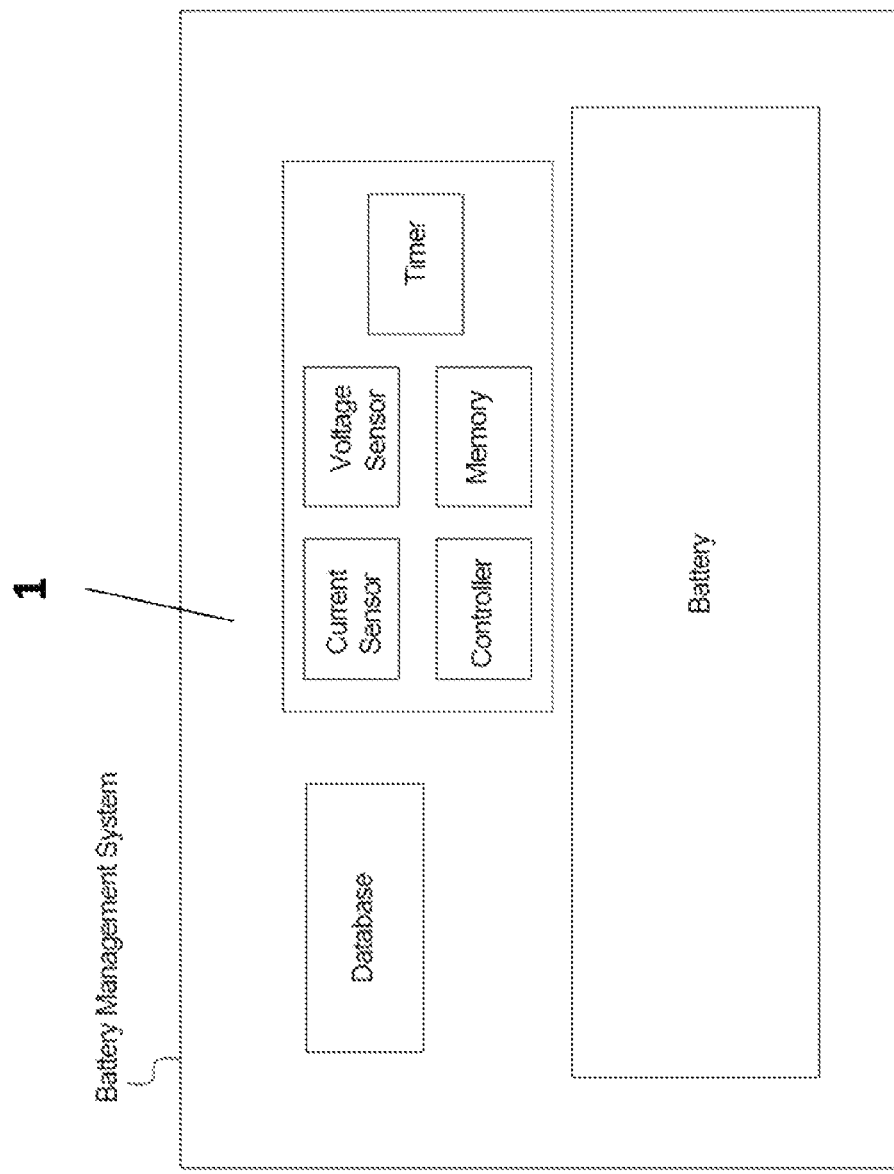
FIG. 1 is a view of the Battery Management System (BMS) controller module and its components.

To facilitate an understanding of the present disclosure, a number of terms and phrases are defined below:

'A-B' Unit: During the transition from steam power to diesel power in the railroad industry, the early diesel locomotives were less powerful than steam locomotives, and the diesel engines were less efficient and less reliable than current medium speed diesel engines. Because of this, it was rare to have a single diesel powered locomotive in a consist. It was so common to have additional locomotives in train consists that many locomotives were produced without an operators cab. These locomotives were called 'B' units, and the locomotives they were connected to would be referred to as an A unit. In conventional practice an A unit could be capable of independent operation without an attending 'B' unit, or some A units could be specially designed to be dependent on a supporting 'B' unit.

Auxiliary Power Unit (APU): When a conventional diesel electric passenger locomotive system is converted to a hybridized system, what was the HEP generator can now be called an Auxiliary Power Unit. This APU will typically be less than half the size of the larger locomotive "prime mover" engine, potentially 500 to 900 kW in size. When the locomotive is in service this engine will at a moderate load continuously with the larger locomotive engine only be turned on or loaded for acceleration events. This name change is due to the functional difference between a HEP generator and the APU. A typical HEP generator only supplies hotel power to the passenger cars. In a hybrid passenger train the APU can supply power to not only the passenger cars, but also to the traction motors and the hybrid energy storage system. The hotel power is generated by a static inverter that is powered off of a common DC power bus. This common DC power bus electrically connects the hybrid energy storage system, the large locomotive engine and the APU which are the three possible power sources on the locomotive. The traction motors also get their power from the common DC power bus so that any one or more of the three power sources can be the supply of propulsion or hotel power. Further the hybrid energy storage system can be charged by any one or more of the traction motors, large locomotive engine or the APU.

Alternative Fuel Tank: A cylinder, group of cylinders, tank or enclosure that can contain compressed or liquid natural gas, hydrogen or other liquefied or gaseous alternative fuel 'B' Unit: See 'A-B' Unit:

Cab car: A cab car defines a rail car used at the opposite end of a passenger train from the locomotive. It will be equipped with a locomotive control system so that the train engineer can operate the passenger train with the locomotive at the rear in a push configuration. Cab cars are sometimes standard passenger cars with an area set aside for the engineer. Sometimes they can be an old locomotive with the diesel engine and traction motors removed also known as a Cab Control Unit (CCU).

Fixed Guideway Vehicle: Fixed guideway vehicles typically refer to rail vehicles that have steel wheels that roll along rails with wheel flanges that keep the vehicle aligned with the track. Some fixed guideway vehicles are now rubber tired and roll along on flat surfaces such as concrete or asphalt. These rubber tired vehicles usually have some automated control system that controls the vehicle steering wheels to keep the vehicle on the intended path. This control system could involve a mechanical device that follows a physical curb to the side raised rib or slot in the path. If not mechanical or it could involve some sensors that give the vehicle an indication of where the intended path is and/or the vehicles location, with the vehicle adjusting the steering to stay on track.

Consist: See Train Set

Head End Power (HEP): A system by which 480 VAC 3-phase electrical power, to operate auxiliaries, is provided to railroad vehicles from a central source via a trainline system. The power source can be locomotive (hence "Head End"), power car, or wayside source. passenger locomotives need hotel power for the passenger car climate control and lights. This is typically provided by a second diesel generator on a locomotive that outputs 480 volts AC at 60 Hertz in the united states, in Canada and Europe HEP power may be provided at a different voltage and frequency such as 575 volts and 50 HZ. In some locomotives, a second engine is not used, and the hotel power is generated by the prime engine which propels the locomotive. This can be done by using a second generator attached to the main engine, or with a static inverter that takes electrical power from the traction alternator or generator and converts that to the appropriate voltage and frequency for hotel power. In this document hotel power will commonly be referred to as HEP HEP jumper cable: A HEP jumper cable is a cable assembly, having the necessary power and control conductors and equipped with a plug on one or both ends, which is used to provide a flexible electrical connection between two cars and/or locomotives or wayside equipment.

HEP Trainlines: In order to transmit HEP power from the locomotive containing the HEP generator to the passenger coaches or other locomotives in the train, a set of high voltage wires and plugs is used. The HEP trainline is an electrical cable system which allows HEP to be transmitted over the entire length of a train. It includes both power and control conductors. The trainline may provide power to equipment in each vehicle, or may simply pass straight through, providing a power path between vehicles on opposite ends of that vehicle. Typical passenger trains in North America have four sets of HEP trainlines that run through each locomotive and each passenger car. Typically, two jumper cables are used on each side of a locomotive or passenger car to connect the HEP trainlines of the two vehicles. Each HEP trainline set is made up of 3 isolated large conductors and 3 small conductors. The small conductors are used to sense if the trainline is 'complete'. If one of the HEP cables would start to fall out of its receptacle, the small wire contacts would become open. The HEP system would detect this opening of the circuit determining that the trainline is not 'complete', and then turn off the main AC contactor for that set of wires. The larger conductors are typically 4/0 wire, and between the four sets of cables, there is the capacity to transmit approximately 1.4 MW of power.

In this document HEP trainlines can also be referred to as HEP cables.

Hybrid Regenerative Braking (HRB): Most passenger and line haul locomotives are equipped with dynamic brake systems that can decelerate the locomotive or maintain a constant speed on a downhill grade by using the traction motors are generators and dissipating the regenerated energy through air cooled resister grids. For Hybrid locomotives, this regenerated energy is diverted from the resistor grid to a LESS. This captured and stored energy is later used to propel the train causing a reduction of fuel use. The act of using Dynamic brake and capturing the energy in a LESS is hereafter referred to as Hybrid Regenerative Braking (HRB).

Locomotive Energy Storage System (LESS): Energy storage system used in rail service for hybridizing a locomotive or train consist. This energy can be stored as kinetic energy in a mechanical flywheel or electrical energy in a battery or capacitor. LESS systems have also been referred to as a Hybrid Energy Storage Systems (HESS). HESS systems have been referred to in many mobile application most commonly in Hybrid transit bus systems. U.S. Pat. No. 9,200,554, incorporated herein by reference, describes a modular battery system appropriate for locomotive use and is incorporated by reference Train Set: a group of 1 or more rail cars pulled by one or more locomotives, also known as a consist MU Trainlines: The control systems and interconnection capabilities have been standardized in the railroad industry over the last several decades. There are now more than 24,000 locomotives operating in North America manufactured by over 6 different companies that can all be interconnected by a 27 point MU cable. This system is built upon a set of 27 MU trainline conductors that run from end to end of every locomotive to MU receptacles at each end of the locomotive. The connecting of two locomotives to operate together only requires the use of an MU jumper cable connecting both locomotives. The 8 notches of throttle power are controlled by a high or low signal on four different wires (3,7,12,15) in the MU 27 point trainline set. In all diesel electric locomotives manufactured from the 1950 up through today, the mechanical throttle lever in each operators cab is directly wired to these four MU trainlines. For this reason there is a mechanical interlock in every locomotive that locks the throttle lever in the idle notch when the forward and reverse lever is removed from the control stand. The practice of removing this forward and reverse lever is what prevents the throttle controllers in multiple operator cabs from interfering with each other. The engine controller in each locomotive is also directly wired to the MU trainlines passing through, it is the fact that the LFO or HCIB control box can intercept the 4 high or low signal wires between the MU trainlines and the engine control that allows these retrofit control systems to operate regardless of the age of the locomotive or the complexity of its engine control. The LFO or HCIB will determine the engineers requested throttle setting by monitoring the MU trainlines and either pass that signal or an alternate signal to the engine controller. his is similar for the dynamic brake control signal which is an infinitely variable 0-72 volt DC signal on trainline 24 is used to indicate the amount of dynamic braking effort requested by the engineer. Again the LFO or HCIB system only needs to intercept this signal to capture the engineers intent and then send an alternate signal to the locomotive dynamic brake controller. AAR S-512-1994, 27-Point Control Plug and Receptacle Stand by the American Association of Railroads covers this topic.

Wayside Power: Also commonly referred to as shore power. There is a trend in many industries to connect mobile pieces of equipment to stationary power sources when not in service to reduce the emissions from idling engines. Shore power likely comes from the use of this technology for ships at port. It is now being implemented as wayside power in trucks at truck stops and also locomotives. In the case of passenger locomotives, implementation of wayside power is relatively easy through the HEP cable system. Wayside power can be connected to a stationary passenger locomotive by connecting it to an appropriate power panel located near the end of the parked train using HEP jumper cables. This is similar to connecting to another rail car.

UC Cells: Ultra capacitor systems are usually built up from individual cells joined in series for higher voltage capacity and also joined in parallel for higher current capacity, UC cells and battery cells can be manufactured in either prismatic shapes or cylinders. In this document, when a UC cell is discussed, it could also be replaced with a similar battery cell and may be either cylindrical or prismatic unless defined in context.

The first portion of the detailed description relates to a Battery Leasing System.

FIG. 1 The preferred embodiment for calculating battery lease cost is to have the Battery Management System BMS 1 keep a cumulative total of energy flows independently for the different lease billing rates. In the typical case this will be a high C-rate total kW-hrs and a low C-rate total of kW-hrs. BMS 1 will frequently read the current and voltage sensor to calculate an instantaneous power (volts*amps) and multiply that by the number of milliseconds between current and voltage readings and divide that by 3,600,000,000 to determine kW-hrs of energy flow. A likely sample rate for a typical BMS could be 10 samples per second, this will vary depending on system design and how fast the load transients are. For lease billing charges the amount of kW-hrs taken into the battery during charging is the important value, but also tracking energy flow during discharge could be used by the BMS for system health checks. In some cases the lease billing may be done by the discharge rate instead of the charging rate, and in some cases the billing rate may be applied to all energy flows. As battery deterioration is more prevalent during charging the preferred embodiment accounts for energy flow only during charging and adds these values to either the high rate energy cumulative total or the low rate cumulative total.

There are many ways to get the billing information from the BMS to the accounting back office where lease charges are calculated and charged. The preferred embodiment would do it wirelessly though a cellular, satellite or WiFi connection.

Figure 2:
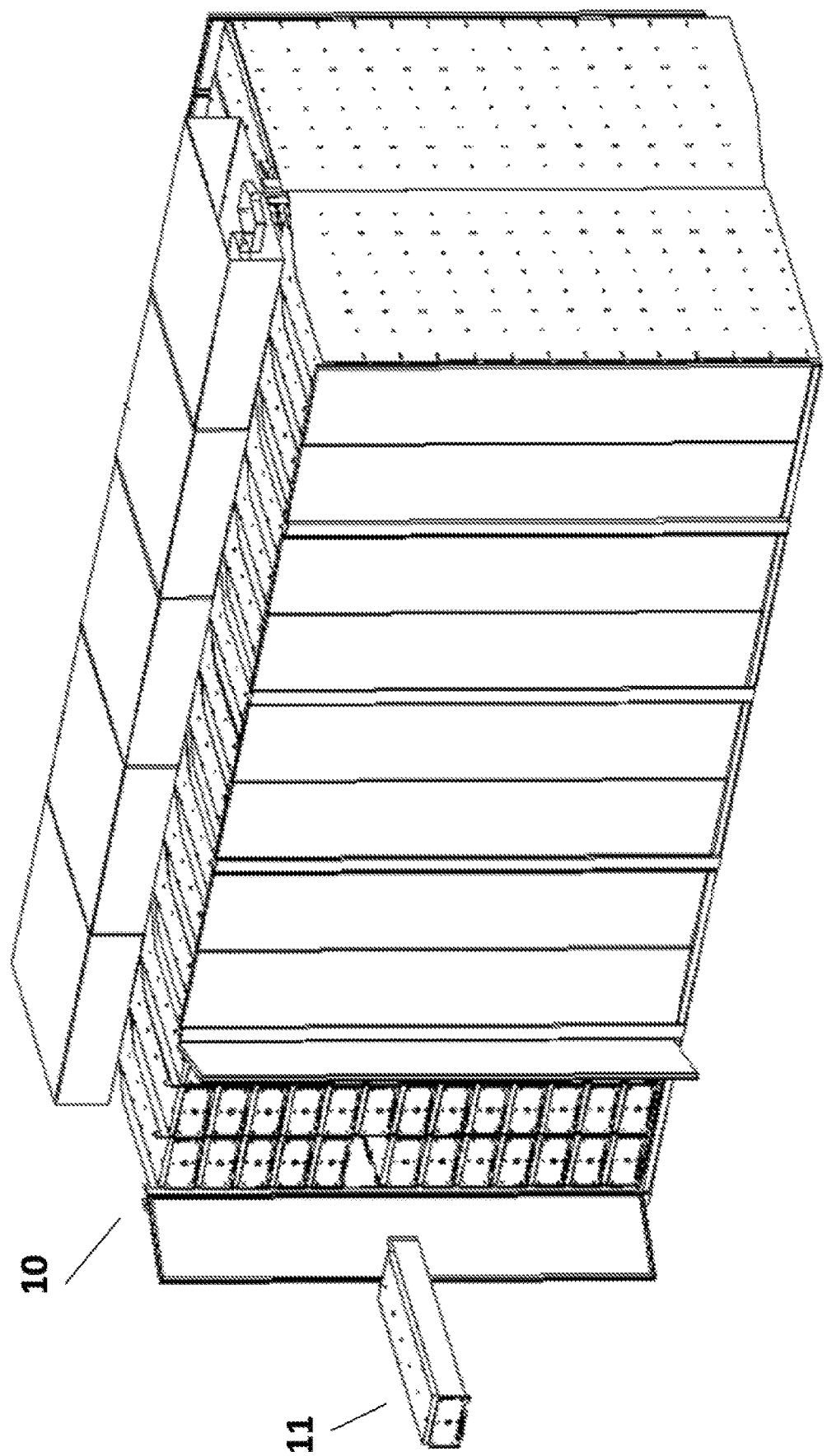
FIG. 2 Is an isometric view of a modular battery system with one of the modules removed.

FIG. 2 is an isometric view of a modular battery system 10 with a single battery module 11 removed. Modular battery systems offer many advantages to a battery system installed on a locomotive. When a battery system is modular there will be a module BMS at each module that communicates to a master BMS that communicates with other vehicle controllers and the outside world. One important advantage when batteries modules of mixed capacity are installed in parallel, the parallel network automatically accommodates batteries of mixed capacity because all the battery modules 11 in the same parallel string will operate at the same voltage when charging or discharging, but they will automatically adjust the current for their capacity. For this reason, in a module battery system it is important to track the current flow for each battery module 11 to calculate its energy flow in and out. Each module 11 could have its own voltage sensor, but the voltage can also be read by the master BMS and transmitted to the module 11 BMS for calculating energy flow using the module 11's internal current reading.

The calculation of the battery module 11 energy flow could be accomplished at the master BMS and this could be where the cumulative module energy flow is stored for each battery module 11. In the preferred embodiment, the battery module 11 would have its own module level BMS controller that reads current and voltage and records the cumulative energy flow storing it internally. Storing the data at the module level makes it easier to swap battery modules between equipment without the need to inform the master BMS what the module 11's history is. For the purposes of accounting and calculation lease payments, when requested the master BMS could poll all of this battery modules 11 for the latest energy flow and then provide that data to the customer or battery owner.

The second portion of the detailed description relates to the installation of Wireless Power Transfer for passenger rail applications.

Figure 3:
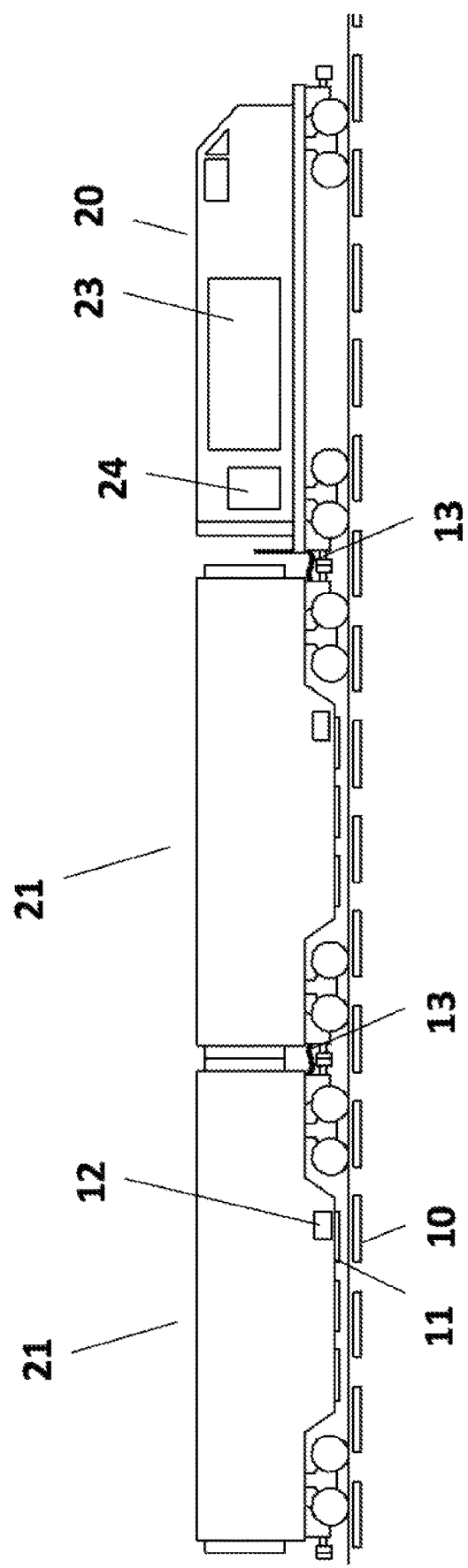
FIG. 3 Is a side view of a passenger train with a battery powered locomotive and WPT receiver pads below the passenger coaches.

FIG. 3 is a side view of a battery powered locomotive 20 pulling two passenger cars 21. The train consist has HEP cables 13 running from one end to the other to conduct hotel power from the Locomotive 20 to the passenger cars 21. Locomotive 20 is equipped with a HEP inverter 24 that takes energy from the LESS 23 and transfers it to the passenger cars 21 through HEP cables 13. Embedded in the track that the train consist travels over are WPT transmitters 10. Underneath the passenger cars 21 are WPT receivers 11 that accept energy from the WPT Transmitters 10. Each passenger car 21 is equipment with an inverter 12 that accepts the power from the WPT receivers 11 and sends that power to the LESS 23 through the HEP cables 13.

The third portion of the detailed description relates to various topologies of WPT transmitters and receivers that will reduce or eliminate the need for precise stopping of fixed guideway vehicles.

Figure 4:
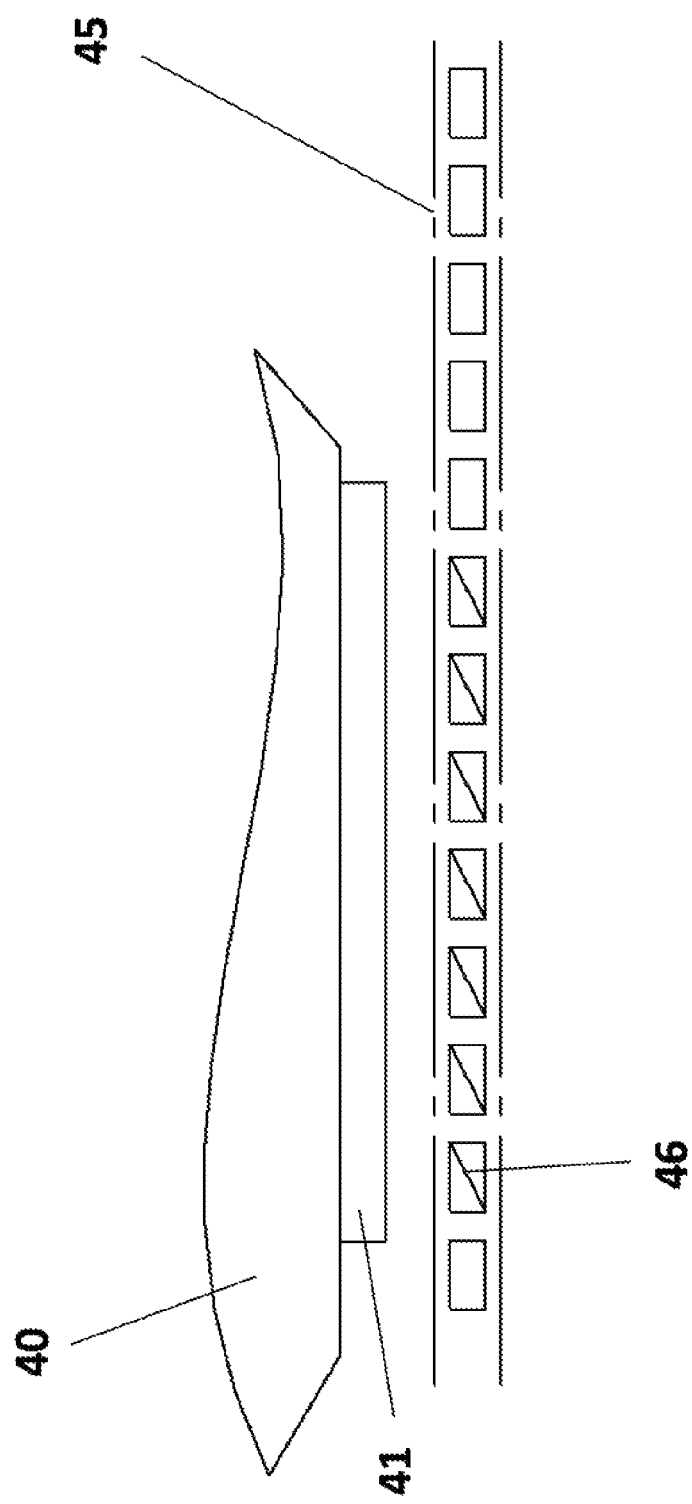
FIG. 4 is a WPT topology with a single long receiver and multiple small transmitters.

FIG. 4 is a cutaway drawing of a WPT topology with a long WPT receiver 41 that is tuned to efficiently receive power from multiple WPT transmitters 46. Receiver 41 is mounted to the under body of vehicle 40 which travels from left to right on a predetermined track. In rail applications, the top surface of transmitters 46 should be flush with or below the top of rail 45. For systems in use with rubber tired vehicles the transmitters 46 could be on top of the ground, but more likely they would be flush with the road surface.

WPT Systems that operate with both the transmitter and receiver circuits at their resonance frequency are the most efficient, in order to maintain a consistent resonant frequency, the number of transmitters transmitting to the receiver should always be the same. This is why receiver 41 is long enough to cover n+1 transmitters 46 no matter where it is along the string of transmitters 46, but only n transmitters will be turned on at any one time. In FIG. 4 some of the transmitters 46 have a diagonal line across them. This is a group of n transmitters 46 for this location of vehicle 40. If vehicle 40 were slowly moving to the right then after the right edge of receiver 41 has crossed completely over the first transmitter 46 that doesn't have a diagonal line, it will turn on that transmitter while turning off the first transmitter from the left with a diagonal line. This allows vehicle 40 to slowly move from left to right and always have n transmitters 46 transferring power to it.

Figure 5A:
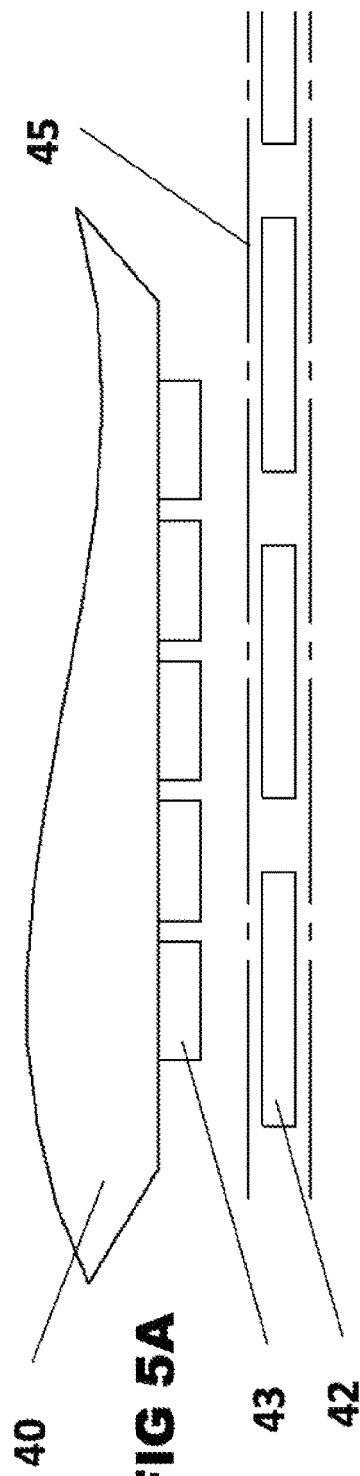
FIG. 5A is a WPT topology with multiple receivers per each transmitter.

FIG. 5A is a WPT topology where each transmitter 42 will physically have multiple receivers 43 over it no matter where vehicle 40 is along the guideway. Transmitter 42 can be tuned to transmit to and resonate with both receivers 43 at the same time. This requires the transmitters 43 to have their waveforms synchronized so that when a receiver 43 is in-between two transmitter 42 units it will accept the appropriate amount of power from each one so that the system is still resonating. In this approach, all the transmitters act as one long transmitter and transfer power to a similar length group of receivers 43. This eliminates the need to electrically disconnect receivers that are not being used, but does add the complexity of synchronizing all of the transmitters 42.

Another approach is using a circuit that can turn off every other receiver 43 so that each transmitter 42 is transferring power to and resonating with the receiver 43 that is closest to being centered above the transmitter 42. In this case each receiver 43 will need a contactor or a power transistor switch that can be used to disconnect the receiver 43 coil from the inverter 12 circuit so it won't draw a load from the transmitter 42. In this case the receivers 43 could be less than half the length of the transmitter 42 so that average offset of the active receivers 43 is in relation to the center of the transmitter 42 is as low as possible for the highest average system efficiency. A transmitter to receiver length ratio of 4:1 would be aggressive, but 3:1 may be reasonable minimizing the average offset distance from the active receiver 43 to transmitter 42.

Figure 5B:
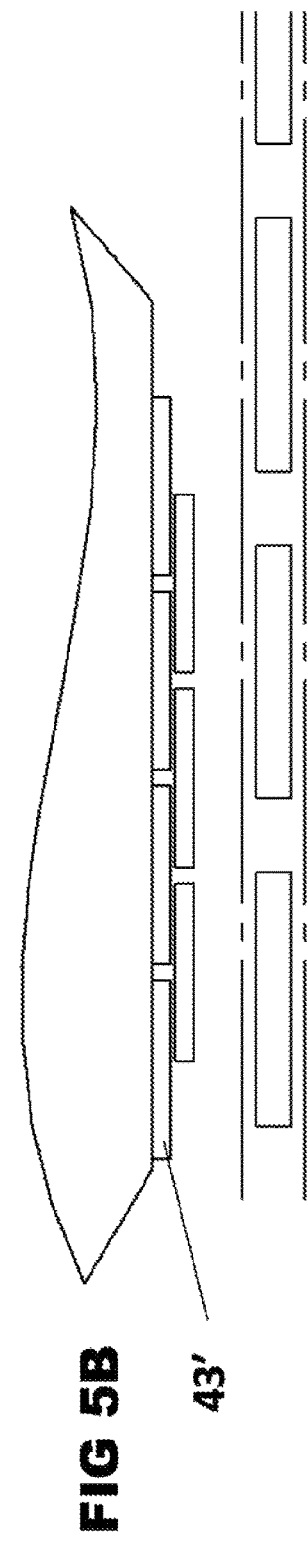
FIG. 5B is a WPT topology with multiple receivers per each transmitter where the receivers overlap and are staggered over and under each other.

FIG. 5B is similar to FIG. 5A except that the receivers 43' are longer, and overlap each other. These receivers 43' coils have to be disconnected from the from the inverter 12 circuit when not being used. By using longer but overlapping receivers the transmitter to receiver length ratio is less than two which may lead to a system efficiency increase. By overlapping the receivers 43', it reduced the average offset of the receiver 43' center to the transmitter 42 center. The downside to the over and under method of overlapping the receivers 43' is that the vertical distance alternates between the active receiver 43' and the transmitter 42 which will require adjustment in the transmitter 42 tuning circuit.

Figure 5C:
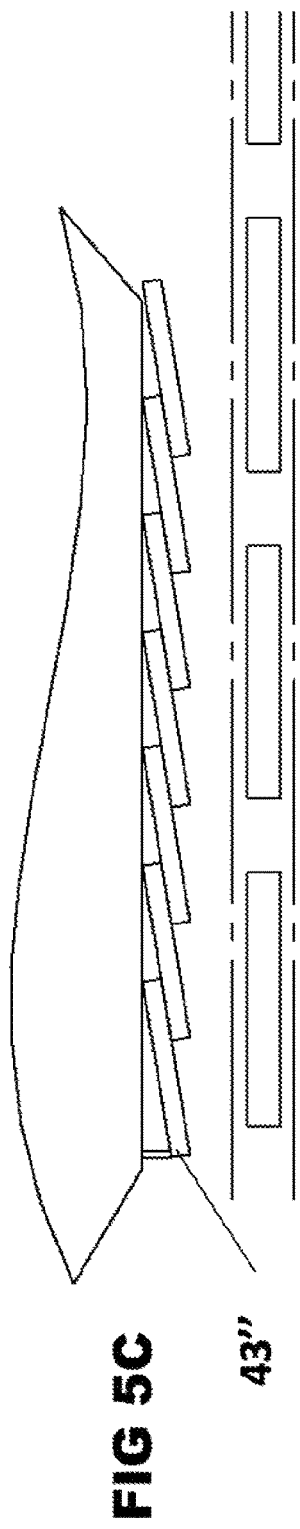
FIG. 5C is a WPT topology with multiple receivers per each transmitter where the receivers are angled so they overlap without alternating over and under.

FIG. 5C is very similar to FIG. 5B with overlapping receivers 43", but in this case there is not the over and under alternating stacking of the receivers as they are angled. This creates a topology with all the benefits of FIG. 5B without the resonant frequency issue of the alternating vertical spacing when incrementing one receiver 43'.

An alternate embodiment of the angled receiver 43" coils is to have the coils jog as if they were pressed on a form with a step in it. This way the sections of the coil are horizontal, but at different vertical height. The coil could have two steps allowing 3 coils to overlap each other. The performance of the stepped coil would be similar to the angled coils in receiver 43", but the manufacturing might be easier.

It should be noted that various changes and modifications to the presently preferred embodiments described herein will be apparent to those skilled in the art. Such changes and modifications may be made without departing from the spirit and scope of the present invention and without diminishing its attendant advantages.

I claim:

1. A wireless power transfer system for a train that includes one or more locomotive units with an energy storage system and one or more passenger cars units that transmit power to the one or more locomotive units, wherein the train travels along a rail on a ground surface, the wireless power transfer system comprising:
   one or more HEP cables through which power is provided from the one or more passenger car units to the one or more locomotive units;
   one or more wireless power transfer (WPT) transmitters mounted to the rail separate from the train;
   a WPT receiver on one of the one or more passenger cars configured to receive power from one of the one or more WPT transmitters; and
   an inverter on the one of the one or more passenger car units connected to the HEP cables, wherein the inverter is configured to receive power from the WPT receiver and to send the power to the energy storage system on the one or more locomotive units through the HEP cables.

2. The wireless power transfer system of claim 1, wherein the one or more WPT transmitters are equally spaced along the rail such that the WPT receiver is constantly receiving power from a set number of WPT transmitters as the train travels along the route.

3. The wireless power transfer system of claim 2, wherein the WPT receiver activates a set number of WPT transmitters located nearby.

4. The wireless power transfer system of claim 3, wherein the WPT receiver deactivates one of the one or more WPT transmitters as it activates a different one of the one or more WPT transmitters in order to maintain the set number of WPT transmitters transmitting power to the WPT receiver.

5. The wireless power transfer system of claim 1, wherein the WPT receiver is positioned on an underside, of the one of the one or more passenger cars.

6. The wireless power transfer system of claim 1, wherein the one or more WPT transmitters are embedded between the rails.

7. The wireless power transfer system of claim 1, wherein the one or more WPT transmitters are one of flush with and below the top of the rail.

8. The wireless power transfer system of claim 1, wherein the ratio of WPT receivers to one or more WPT transmitters is greater than 1:1.

9. The wireless power transfer system of claim 1, wherein the energy storage system comprises a battery.

10. A train that travels along a rail including one or more one or more wireless power transfer (WPT) transmitters, the train comprising:
   a locomotive unit with an energy storage system;
   a passenger car that receives power from the locomotive unit;
   one or more HEP cables through which power is provided to and from the locomotive unit to the passenger car;
   one or more one or more wireless power transfer (WPT) transmitters mounted to the rail along the route separate from the train;
   a WPT receiver on the passenger car configured to receive power from one of the one or more WPT transmitters; and
   an inverter on the passenger car connected to the HEP cables, wherein the inverter is configured to receive power from the WPT receiver and to send the power to the energy storage system on the locomotive unit through the HEP cables;
   wherein the one or more WPT transmitters are equally spaced along the rail such that the WPT receiver is constantly receiving power from a set number of WPT transmitters as the train travels along the route.

11. The train of claim 10, wherein the WPT receiver activates a set number of WPT transmitters located nearby.

12. The train of claim 10, wherein the WPT receiver deactivates one of the one or more WPT transmitters as it activates a different one of the one or more WPT transmitters in order to maintain the set number of WPT transmitters transmitting power to the WPT receiver.

13. The locomotive consist of claim 10, wherein the ratio of WPT receivers to WPT transmitters is greater than 1:1.

14. A wireless power transfer system for a ground vehicle including an energy storage system, wherein the ground vehicle travels along a route on a ground surface the wireless power transfer system comprising:
   one or more wireless power transfer (WPT) transmitters mounted to the ground surface; and
   a WPT receiver on the ground vehicle configured to receive power from one of the one or more WPT transmitter, wherein the power is transmitted to the energy storage system;
   wherein the one or more WPT transmitters are equally spaced along the route such that the WPT receiver is constantly receiving power from a set number of WPT transmitters as the ground vehicle travels along the route.

15. The wireless power transfer system of claim 14, wherein the WPT receiver activates a set number of WPT transmitters located nearby.

16. The wireless power transfer system of claim 15, wherein the WPT receiver deactivates one of the one or more WPT transmitters as it activates a different one of the one or more WPT transmitters in order to maintain the set number of WPT transmitters transmitting power to the WPT receiver.

17. The wireless power transfer system of claim 14, wherein the ground vehicle comprises one or more locomotive units that travel along a rail on the ground surface.

18. The wireless power transfer system of claim 14, wherein the ground vehicle includes rubber tires that travels along the route.

19. The wireless power transfer system of claim 18, wherein the one or more WPT transmitters are positioned along the route on the ground surface.

20. The wireless power transfer system of claim 19, wherein the one or more WPT transmitters are flush with the ground surface along the route.

* * * * *